(12) United States Patent
Kitamura

(10) Patent No.: US 6,372,617 B1
(45) Date of Patent: Apr. 16, 2002

(54) METHOD OF MANUFACTURING NON-VOLATILE MEMORY

(75) Inventor: Takuya Kitamura, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/684,631

(22) Filed: Oct. 10, 2000

Related U.S. Application Data

(62) Division of application No. 09/211,001, filed on Dec. 15, 1998, now abandoned.

(30) Foreign Application Priority Data

Dec. 17, 1997 (JP) .............................................. 9-347931

(51) Int. Cl.⁷ ......................................... H01L 21/8247
(52) U.S. Cl. ...................................... 438/593; 438/594
(58) Field of Search .................................. 438/593, 594

(56) References Cited

U.S. PATENT DOCUMENTS 5,767,005 A * 6/1998 Doan et al. .................. 438/593

FOREIGN PATENT DOCUMENTS

| JP | 3-34578 | 2/1991 |
| JP | 8-70106 | 3/1996 |
| JP | 8-204031 | 8/1996 |
| JP | 9-148460 | 6/1997 |

* cited by examiner

Primary Examiner—Richard Booth
(74) Attorney, Agent, or Firm—Sughrue Mion, PLLC

(57) ABSTRACT

A method of manufacturing non-volatile memory enables a junction capacitance to be increased between a control gate and a floating gate and realizes low voltage and high speed operation by virtue of adaptation of chemical mechanical polishing technology and dry etching technology with the exception that it causes cell area to be increased. There is provided with floating gates formed on a semiconductor-substrate through a first gate insulating film, a control gate which is subjected to capacitive junction to the floating gates through a second gate insulating film. The floating gates have deeper concave shape than a regular concave shape which is formed on a semiconductor-substrate while reflecting shape-of-substrates. There is provided a second gate insulating film at least on the inside surface of concave shaped side wall of the floating gates.

2 Claims, 6 Drawing Sheets

METHOD OF MANUFACTURING NON-VOLATILE MEMORY

CROSS REFERENCE TO RELATED APPLICATION

This is a division of application Ser. No. 09/211,001 filed Dec. 15, 1998, now abandoned the entire disclosure of which is incorporated herein by reference.

BACKGROUND OF THE INVENTION

The present invention relates to a non-volatile semiconductor memory. More to particularly this invention relates to structure and manufacturing method of a memory cell of a flash memory.

DESCRIPTION OF THE PRIOR ART

FIG. 1 is a sectional view showing general former floating gate type semiconductor non-volatile memory. In the conventional example of the floating gate type semiconductor non-volatile memory as shown in FIG. 1, there is formed N-type source 9 and drain 10 on a memory cell region at a distance, such the memory cell region is isolated electrically from adjacent regions by means of a field insulating film 2 on the surface of P-type silicone substrate 1. A channel region 16 of the memory cell is formed at a region held between the drain and the source. There is formed a floating gate 4 on the channel region 16 through the first gate insulating film 3. There is formed a control gate 8 on the floating gate 4 through the second gate insulating film 7.

The conventional example of the floating gate type semiconductor non-volatile memory as shown in FIG. 1 is manufactured in such a way that it causes the field insulating film 2, the first gate insulating film 3, the channel region 16 and so forth to be formed on the silicon substrate 1, then accumulating poly-crystal silicon film of the whole surface of the substrate to be processed into the shape of the floating gate, subsequently, forming the floating gate 4, the drain 10, and source 9 respectively while introducing N-type impurity, then forming silicon oxide film due to heat oxidization at the surface thereof, thus forming the second gate insulating film 7 consisting of only the silicon oxide film or laminated film of silicon oxide film and silicon nitride film. Further, it causes the control gate 8 to be formed with the result that the floating gate type semiconductor non-volatile memory is formed.

Now, writing characteristic of the non-volatile memory is determined by the channel region of the first gate insulating film, the capacitive junction between the floating gates, the floating gate of the second gate insulating film, and the capacitive division in the capacitive junction between the control gates. Consequently, it is necessary to increase the capacitive junction between the floating gates of the second gate insulating film and the control gate.

In order to cope with the above-described matter, there is laid the floating gate on the field insulating film flatly. For this reason, it is difficult to make the floating gate type semiconductor non-volatile memory large capacitance.

FIG. 2A is a plan view showing a configuration of the conventional example. FIG. 2B is sectional view along line B–B' of FIG. 2A. As shown in FIGS. 2A and 2B, the floating gate type semiconductor non-volatile memory is constituted by the floating gate 17 formed on the semiconductor-substrate 1 through the first gate oxide film 3, and the control gate 8 which is subjected to capacitive junction in relation to the floating gate 17 through the second gate insulating film 7. There is developed structure in which there exists a concave shaped floating gate which is deeper than a regular concave shape formed while reflecting shape-of-substrates, there is formed the second gate insulating film at least on the inside surface of side wall of the concave shape of the floating gate.

However, it is necessary to increase the lithography process being in use for forming groove in order to process the floating gate 17 into the concave shape as shown in FIG. 2B. Further, it is necessary to make sure of dimensions between the inner parts of the side wall of the concave shaped floating gate more than the minimum dimensions of the photo lithography. For this reason, it becomes difficult to adjust respective shapes with each other (mis-alignment), thus dispersion of shapes of the floating gate occurs so that there occurs the problem of increasing dispersion of the capacitive junction. Furthermore, in order to avoid this problem, when it causes width of the floating gate to be increased, there is the problem that it becomes unsuitable for making the non-volatile memory large capacitance.

SUMMARY OF THE INVENTION

In view of the foregoing, it is an object of the present invention for resolving the above-mentioned problems to provide a non-volatile memory and a manufacturing method thereof which realizes low voltage and high speed operation while increasing junction capacitance between the control gate and the floating gate due to conformity of chemical-mechanical polishing technology and dry etching technology with the exception of increasing of cell area.

According to one aspect of the present invention to provide a non-volatile memory which is a floating gate type semiconductor nonvolatile memory consisting of a floating gate formed on a semiconductor-substrate through a first gate insulating film, and a control gate which is subjected to capacitive junction in relation to the floating gate through a second gate insulating film, the non-volatile memory comprises a floating gate of deeper concave shape than a regular concave shape which is formed on the semiconductor-substrate while reflecting the shape-of-substrates, and a second gate insulating film which is provided for at least on the inside surface of a concave shaped side wall of said floating gate.

According to another aspect of the present invention to provide a non-volatile memory in which the control gate is formed in specific configuration in relation to the direction of a groove of the concave shape in the floating gate, and the control gate is disposed on the inside of the concave shape.

According to another aspect of the present invention to provide a non-volatile memory in which the control gate is formed in parallel to the direction of the groove of the concave shape in the floating gate.

According to another aspect of the present invention to provide a non-volatile memory in which the control gate is formed in perpendicular to the direction of the groove of the concave shape in the floating gate.

According to another aspect of the present invention to provide a manufacturing method of a floating gate type semiconductor non-volatile memory consisting of a floating gate formed on a semiconductor-substrate through a first gate insulating film, and a control gate which is subjected to capacitive junction in relation to the floating gate through a second gate insulating film comprising the steps of forming the floating gate by amorphous silicon film, poly-crystal silicon film or combination thereof, and forming the floating gate into deeper concave shape than a regular concave shape which is formed on a semiconductor-substrate while reflecting shape-of-substrates by virtue of combination of chemical mechanical polishing technology and dry etching technology of silicon with the exception of combination of photolithography technology and the dry etching technology of the silicon.

As stated above, in a floating gate type semiconductor non-volatile memory (floating gate type memory cell) and manufacturing method thereof according to the present invention, there is formed shape of floating gate into concave shape in the self-adjustment way by virtue of adaptation of chemical mechanical polishing technology and dry etching technology with the exception that there is newly introduced lithography technology, then forming the second gate insulating film and the control gate along thereto, thereby enabling junction capacitance to be increased between the control gate and the floating gate, thus it causes low voltage and high speed operation to be possible.

The above and further objects and novel features of the invention will be more fully understood from the following detailed description when the same is read in connection with the accompanying drawings. It should be expressly understood, however, that the drawings are for purpose of illustration only and are not intended as a definition of the limits of the invention.

BRIEF DESCRIPTION OF THE DRAWINGS

FIG. 3A is a sectional view along the line A–A' of FIG. 3C, FIG. 3B is a sectional view along the line B–B' of FIG. 3C, and FIG. 3C is a plan view thereof;

DETAILED DESCRIPTION OF THE PREFERRED EMBODIMENTS

Preferred embodiments of the present invention will be described in detail in accordance with the accompanying drawings.

Figure 1:
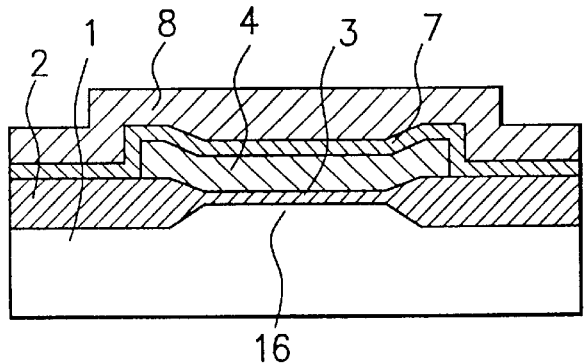
FIG. 1 is a sectional view showing a general constitution of the non-volatile memory.
Figure 2A:
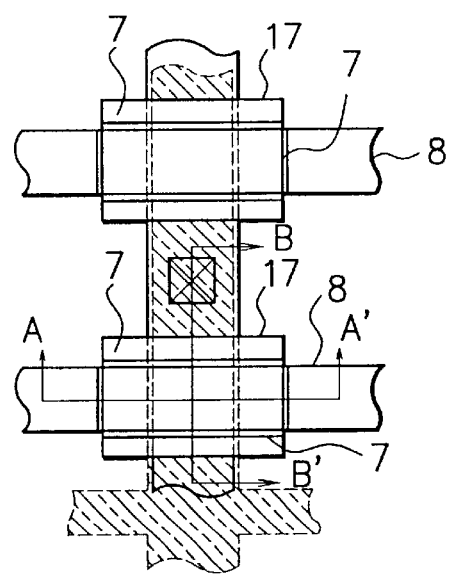
FIG. 2A is a plan view showing a configuration of the conventional example.
Figure 2B:
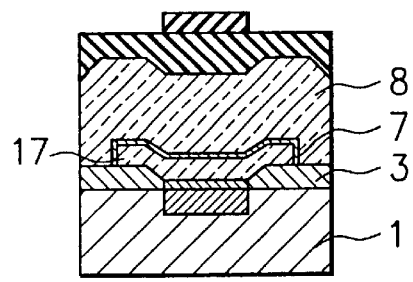
FIG. 2B is a sectional view along line B–B' of FIG. 2A.
Figure 3A:
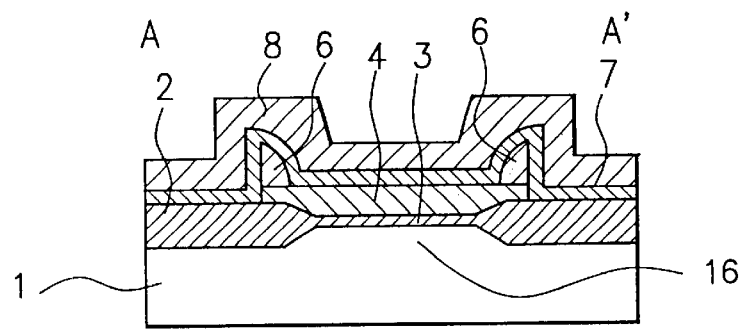
FIGS. 3A, 3B, and 3C are views showing a floating gate type semiconductor non-volatile memory (floating gate type memory cell) according to an embodiment 1 of the present invention.
Figure 3B:
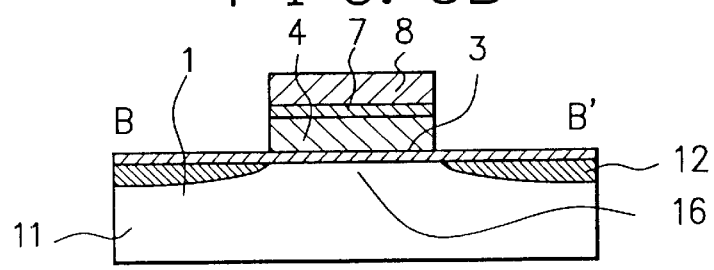
Figure 3C:
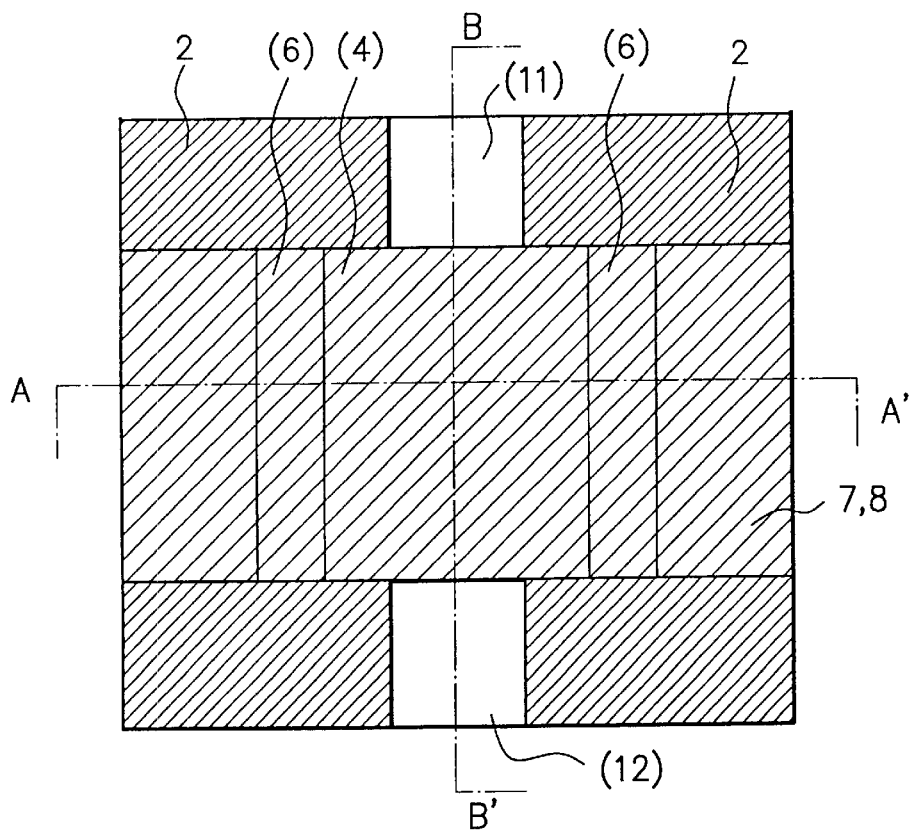

FIGS. 3A, 3B, and 3C are views showing a floating gate type semiconductor non-volatile memory (floating gate type memory cell) according to an embodiment 1 of the present invention. FIG. 3A is a sectional view along the line A–A' of FIG. 3C, FIG. 3B is a sectional view along the line B–B' of FIG. 3C, and FIG. 3C is a plan view thereof;

The floating gate type semiconductor non-volatile memory (floating gate type memory cell) according to the embodiment 1 of the present invention consists of floating gates 4 and 6 formed on a semiconductor-substrate 1 through the first gate insulating film 3, and a control gate 8 being subjected to capacitive junction to the floating gates 4 and 6 through the second gate insulating film 7. The floating gates 4 and 6 are shaped into deeper concave shape than a regular concave shape which is formed while reflecting the shape of substrates. There is provided with the second gate insulating film 7 at least on the inside surface of the concave shaped side wall of the floating gates 4 and 6.

The control gate 8 is arranged on the inside of the concave shape of the floating gates 4 and 6 in such a position that the control gate 8 is formed parallel to or perpendicular to the direction of the concave shaped groove in the floating gates 4 and 6.

The non-volatile memory shown in FIGS. 3A to 3C is manufactured is such a way that there is implemented processing of forming deep concave shaped floating gates 4 and 6 based on amorphous silicon film, poly-crystal silicon film, or a combination thereof. Furthermore, there is implemented processing of forming the floating gates 4 and 6 into a deep concave shape by virtue of the combination of the chemical mechanical polishing technology (hereinafter "CMP") and dry etching technology of the silicon with the exception of the combination of the photolithography technology and the dry etching technology of the silicon.

[EMBODIMENT 1]

Next, the concrete example will be described referring to FIGS. 4A to 4J by way of the embodiment 1. FIGS. 4A to 4I are sectional views showing manufacturing method in process order of the floating gate type semiconductor non-volatile memory (floating gate type memory cell) according to the embodiment 1 of the present invention. FIG. 4J is a sectional view along with direction of the source and drain. In the memory cell according to the embodiment of the present invention, there are used a silicon film by way of the semiconductor film, a silicon oxide film by way of the gate oxide film, a silicon oxide film by way of the insulating film, and a silicon-substrate by way of the semiconductor-substrate.

Figure 4A:
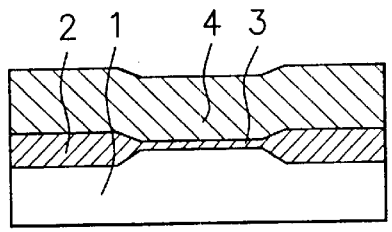
FIGS. 4A to 4I are sectional views showing manufacturing method of the floating gate type semiconductor non-volatile memory (floating gate type memory cell) according to the embodiment 1 of the present invention in order of the process.

Firstly, as shown in FIG. 4A, there is formed a first (tunnel) gate oxide film 3 with film thickness of 80 Å by thermal oxidization method at an element region on the silicon-substrate 1 on which a field insulating film 2 is formed through LOCOS (local oxide silicon) separation method. Subsequently, there is formed a poly-silicon film 4 with film thickness of 3000 Å for a floating gate electrode (floating gate 4) through CVD (chemical vapor deposition) method.

Next, there is formed a floating gate 4, while processing the poly-silicon film 4 into the stripe shape by virtue of photolithography technology and dry etching technology.

Figure 4B:
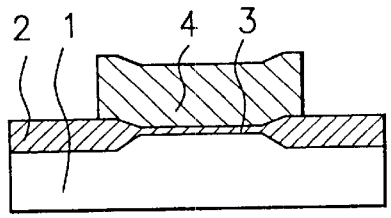
Figure 4C:
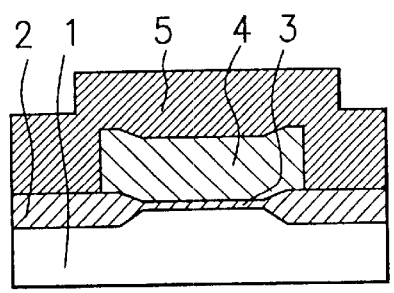
Figure 4D:
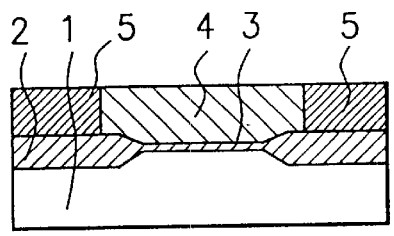

Continuously, as shown in FIG. 4B, there is formed a silicon nitride film (embedded insulating film) 5 with film thickness of 4000 Å on the whole surface of the substrate through the CVD method, furthermore, as shown in FIG. 4D, the silicon nitride film is polished flatly by CMP as far as the floating gate 4 being exposed.

Figure 4E:
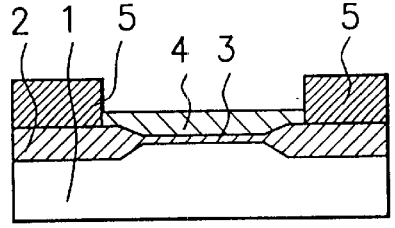

Subsequently, as shown in FIG. 4E, there is dug down the floating gate 4 as far as the film thickness becoming 1500 Å through the dry etching technology.

Figure 4F:
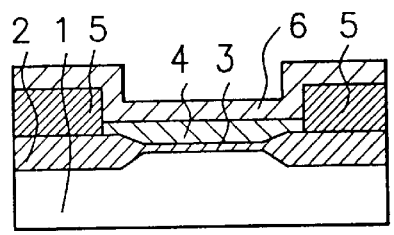

Next, as shown in FIG. 4F, there is formed a poly-silicon film (floating gate) 6 with film thickness of 1500 Å on the whole surface of the substrate through the CVD method.

Figure 4G:
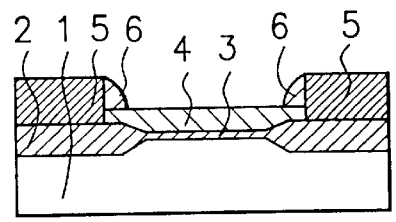

Next, as shown in FIG. 4G, there is formed a side wall on the concave side wall of the silicon nitride film 5 by means of the poly-silicon film 6 in such a way that the poly-silicon film 6 is subjected to etch back as far as the silicon nitride film 5 being exposed, with anisotropy dry etching used, thus using this side wall by way of the floating gate 6. Consequently, in the embodiment 1 of the present invention, the floating gate 6 rises from both ends of the floating gate 4, and the floating gate electrode is constituted from combination of the floating gates 4 and 6, thus being formed as the groove with deep concave shape corresponding to quantity that the floating gate 6 rises from the floating gate 4.

Figure 4H:
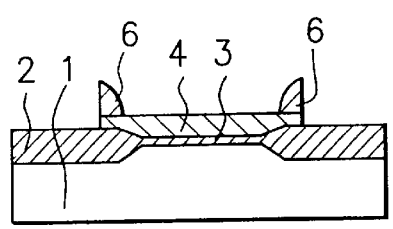
Figure 4I:
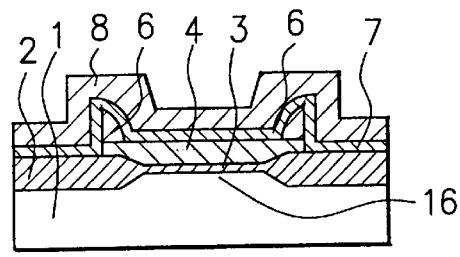
Figure 4J:
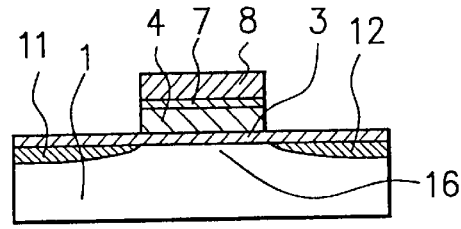
FIG. 4J is a sectional view showing such non-volatile memory in the source to drain direction.

Next, as shown in FIG. 4H, there is removed the silicon nitride film 5 for the sake of embedding by wet etching from the silicon-substrate, furthermore, as shown in FIG. 4I forming ONO (silicon oxide-silicon nitride-silicon oxide) film 7 to be the second gate insulating film of the whole surface of the substrate. Moreover, there is accumulated the poly-silicon film (control gate) 8 for the control gate electrode of the whole surface of the silicon-substrate, then as shown in FIG. 4J, forming the control gate 8 consisting of the poly-silicon film, while etching-processing the poly-silicon film 8 into stripe shaped pattern which is perpendicular to the stripe shaped floating gates 4 and 6 by virtue of the photolithography technology and the dry etching. In this case, there is processed by etching the control gate (control gate electrode) 8, the second gate insulating film 7, and the floating gates (floating gate electrode) 4 and 6 as far as the first gate insulating film being exposed. The control gate (control gate electrode) 8 becomes control gate electrode pattern corresponding to the word line.

Lastly, there is formed the source 11 and the drain diffusion layer 12, while implementing ion implantation of arsenic with the control gate (control gate electrode) 8 as a mask.

As described above in the embodiment 1 of the present invention, it enables the junction capacitance to be increased between the control gate 8 and the floating gates 4 and 6 in such a way that there is formed the shape of the floating gates 4 and 6 into deep concave shape with self-adjustment, to form the second gate insulating film 7 and the control gate 8 along the floating gates 4 and 6, due to adaptation of the CMP technology and the dry etching technology without introduction of new lithography technology, thus it is capable of realizing low voltage, and high speed operation with the exception that it causes occupied area of memory cell to be increased.

[EMBODIMENT 2]

FIGS. 5A to 5I are sectional views showing manufacturing method in process order of the floating gate type semiconductor non-volatile memory (floating gate type memory cell) according to the embodiment 2 of the present invention. FIG. 5J is a sectional view along with direction of the source and drain.

Figure 5A:
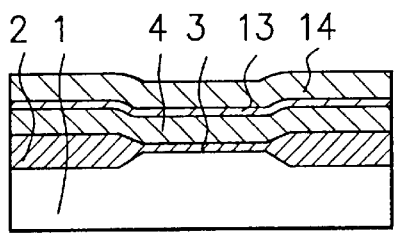
FIGS. 5A to 5I are sectional views showing manufacturing method of the floating gate type semiconductor non-volatile memory (floating gate type memory cell) according to the embodiment 2 of the present invention in order of the process.
Figure 5F:
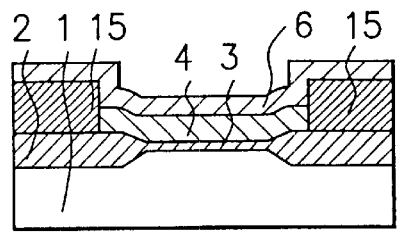
Figure 5B:
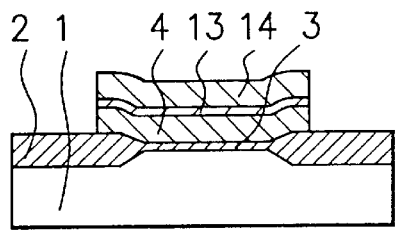
Figure 5G:
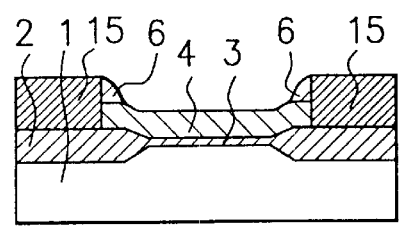

Firstly, as shown in FIG. 5A, there is formed a first gate insulating film 3 with film thickness of 80 Å by thermal oxidization method at an element region on the silicon-substrate 1 on which a field insulating film 2 is formed through LOCOS (local oxide silicon) separation method. Subsequently, there is formed successively a poly-silicon film 4 of film thickness of 1500 Å for the sake of a floating gate electrode (floating gate), a silicon oxide film 13 of film thickness of 300 Å for the sake of stopper of CMP, and a silicon nitride film 14 of film thickness of 1800 Å through CVD (chemical vapor deposition) method.

Next, there is processed the poly-silicon film 4, the silicon oxide film 13, and the silicon nitride film 14 into the stripe shape by virtue of photolithography technology and dry etching technology .

Figure 5C:
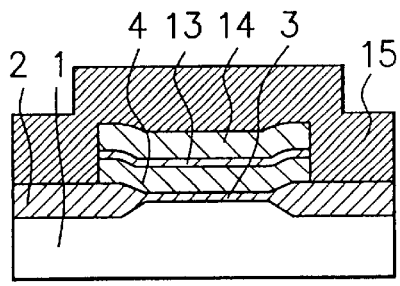
Figure 5H:
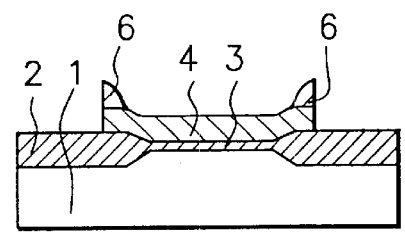
Figure 5D:
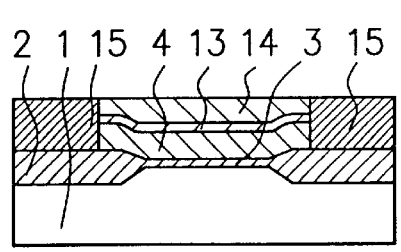
Figure 5I:
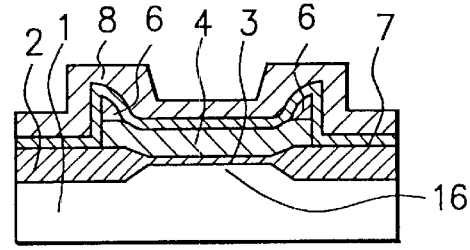

Next, as shown in FIG. 5C, there is formed a silicon oxide film 15 with film thickness of 4000 Å of the whole surface of the silicon-substrate through the CVD method, furthermore, as shown in FIG. 5D, the silicon nitride film 14 is polished flatly by CMP as far as the silicon nitride film 14 for the sake of the CMP stopper being exposed.

Figure 5E:
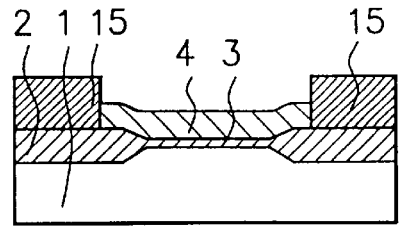
Figure 5J:
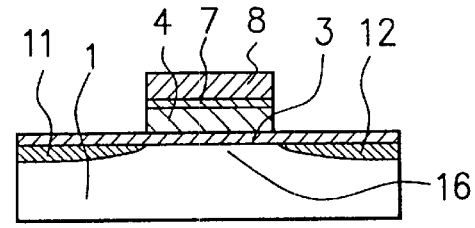
FIG. 5J is a sectional view showing such non-volatile memory in the source to drain direction.

Subsequently, as shown in FIG. 5E, there is removed the silicon nitride film 14 for the sake of the CMP stopper, and the silicon oxide film 13 at under layer thereof through the wet etching.

Next, as shown in FIG. 5F, there is formed a poly-silicon film (floating gate) 6 with film thickness of 1500 Å of the whole surface of the silicon-substrate through the CVD method.

Next, as shown in FIG. 5G, there is formed a side wall on the concave shaped side wall of the silicon oxide film 15 by the poly-silicon film 6 in such a way that the poly-silicon film 6 is subjected to etch back as far as the silicon oxide film 15 being exposed, with anisotropy dry etching used, thus using this side wall by way of the floating gate 6. Consequently, in the embodiment 2 of the present invention, the floating gate 6 rises from both ends of the floating gate 4, and the floating gate electrode is constituted from combination of the floating gates 4 and 6, thus being formed as the groove with deep concave shape corresponding to quantity that the floating gate 6 rises from the floating gate 4.

Next, as shown in FIG. 5H, there is removed the silicon oxide film 15 through the wet etching.

Next, as shown in FIG. 5I, there is formed ONO (silicon oxide-silicon nitride-silicon oxide) film 7 to be the second gate electrode of the whole surface of the silicon-substrate. Moreover, there is accumulated the poly-silicon film (control gate) 8 for the sake of the control gate electrode of the whole surface of the silicon substrate, then as shown in FIG. 5J, forming the control gate 8 consisting of the poly-silicon film, while etching-processing the poly-silicon film 8 into stripe shaped pattern which is perpendicular to the stripe shaped floating gates 4 and 6 by virtue of the photolithography technology and the dry etching technology. In this case, there is etching-processed the control gate (control gate electrode) 8, the second gate insulating film 7, and the floating gates (floating gate electrode) 4 and 6 as far as the first gate insulating film 3 being exposed. The control gate (control gate electrode) 8 becomes control gate electrode pattern corresponding to the word line.

Lastly, there is formed the source 11 and the drain diffusion layer 12, while implementing ion implantation of arsenic with the control gate (control gate electrode) 8 as a mask.

[EMBODIMENT 3]

FIGS. 6A to 6I are sectional views showing manufacturing method in process order of the floating gate type semiconductor non-volatile memory (floating gate type memory cell) according to the embodiment 3 of the present invention. FIG. 6J is a sectional view along with direction of the source and drain. The element separation is not restricted to the LOCOS (local oxide silicon) separation method, but it is capable of applying the recess LOCOS (local oxide silicon ), STI (Shallow Trench Isolation ). Further, the shape of the floating gate is not restricted to the shape which is elongated to the element separation region. An embodiment which is not overlapped with the element separation region will be described in accordance with FIGS. 6A to 6J.

Figure 6A:
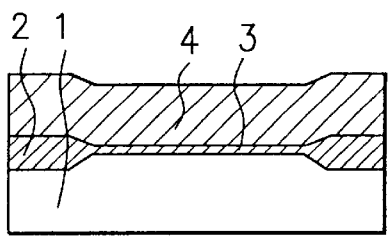
FIGS. 6A to 6I are sectional views showing manufacturing method of the floating gate type semiconductor non-volatile memory (floating gate type memory cell) according to the embodiment 3 of the present invention in order of the process.
Figure 6F:
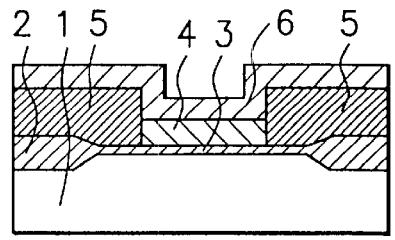

Firstly, as shown in FIG. 6A, there is formed a first gate insulating film 3 with film thickness of 80 Å by thermal oxidization method at an element region on the silicon-substrate 1 on which a field insulating film 2 is formed through LOCOS (local oxide silicon) separation method. Subsequently, there is formed successively a poly-silicon film 4 with film thickness of 3000 Å for the sake of a floating gate electrode (floating gate), through CVD (chemical vapor deposition) method.

Figure 6B:
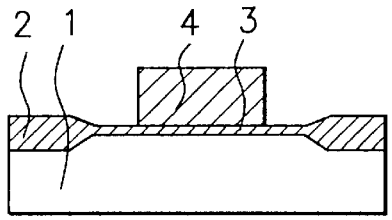
Figure 6G:
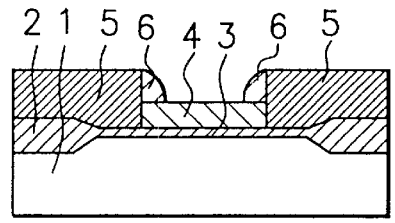
Figure 6C:
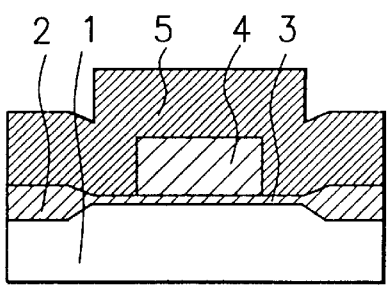
Figure 6H:
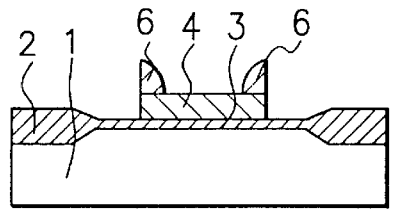

Next, as shown in FIG. 6B, there is processed the poly-silicon film 4 into the stripe shape by virtue of photolithography technology and dry etching technology to form the floating gate 4 consisting of the poly-silicon film. There is formed the source 11 and the drain diffusion layer 12, while implementing ion implantation of arsenic with the control gate (control gate electrode) 8 as a mask (in accordance with FIG. 6I).

Figure 6D:
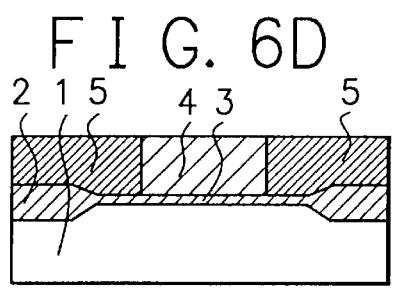
Figure 6I:
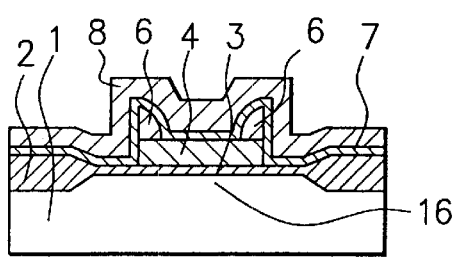

Next, there is formed the silicon nitride film 5 with film thickness of 4000 Å for the sake of the embedding film of the whole surface of the silicon-substrate through the CVD method, continuously, as shown in FIG. 6D, the silicon nitride film 5 is polished flatly by CMP as far as the poly-silicon film 4 being exposed.

Figure 6E:
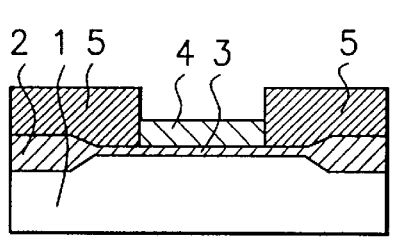
Figure 6J:
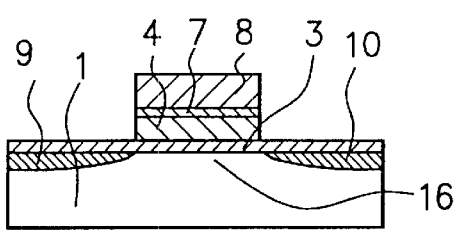
FIG. 6J is a sectional view showing such non-volatile memory in the source to drain direction.

Subsequently, as shown in FIG. 6E, there is dug down the poly-silicon film 4 for the sake of the floating gate electrode as far as the film thickness becoming 1500 Å through the dry etching technology.

Next, as shown in FIG. 6F, there is formed the poly-silicon film (floating gate) 6 with film thickness of 1500 Å of the whole surface of the substrate through the CVD method.

Continuously, as shown in FIG. 6G, there is formed a side wall on the concave shaped side wall of the silicon nitride film 5 by the poly-silicon film 6 in such a way that the poly-silicon film 6 is subjected to etch back as far as the silicon nitride film 5 being exposed, with anisotropy dry etching used, thus using this side wall by way of the floating gate 6. Consequently, in the embodiment 3 of the present invention, the floating gate 6 rises from both ends of the floating gate 4, and the floating gate electrode is constituted from combination of the floating gates 4 and 6, thus being formed as the groove with deep concave shape corresponding to quantity that the floating gate 6 rises from the floating gate 4.

Next, as shown in FIG. 6H, there is removed the silicon nitride film 5 through the wet etching.

Next, as shown in FIG. 6I, there is formed the ONO (silicon oxide-silicon nitride-silicon oxide) film 7 to be the second gate electrode of the whole surface of the silicon-substrate. Moreover, there is accumulated the poly-silicon film (control gate) 8 for the sake of the control gate electrode of the whole surface of the silicon-substrate, then as shown in FIG. 6J, forming the control gate 8 consisting of the poly-silicon film, while being etching-processed the poly-silicon film 8 into stripe shaped pattern which is perpendicular to the stripe shaped floating gates 4 and 6 by virtue of the photolithography technology and the dry etching. In this case, there is etching-processed the control gate (control gate electrode) 8, the second gate insulating film 7, and the floating gates (floating gate electrode) 4 and 6 as far as the first gate insulating film 3 being exposed. The control gate (control gate electrode) 8 becomes control gate electrode pattern corresponding to the word line.

In the embodiments described above, there is increased the junction capacitance between the floating gates 4 and 6 and the control gate (control gate electrode) 8, while elongating to be arranged the floating gate (floating gate electrode) on the field insulating film. However, it is capable of increasing the junction capacitance sufficiently, even though the width of the floating gate (floating gate electrode) is narrower than the width of the field as shown in the embodiment 3 of the present invention, with the result that it becomes possible to cut down the cell area.

[EMBODIMENT 4]

FIGS. 7A to 7I are sectional views showing manufacturing method in process order of the floating gate type semiconductor non-volatile memory (floating gate type memory cell) according to the embodiment 4 of the present invention. FIG. 7J is a sectional view along with direction of the source and drain. Further, the arrangement of the source-drain diffusion layer is not restricted in the perpendicular direction to the elongated direction of the control gate. There will be described an embodiment in which the source-drain diffusion layer is arranged in the parallel direction to the elongated direction of the control gate in accordance with FIGS. 7A to 7J.

Figure 7A:
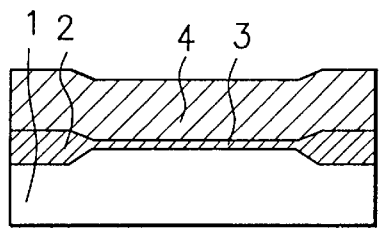
FIGS. 7A to 7I are sectional views showing manufacturing method of the floating gate type semiconductor non-volatile memory (floating gate type memory cell) according to the embodiment 4 of the present invention in order of the process.
Figure 7F:
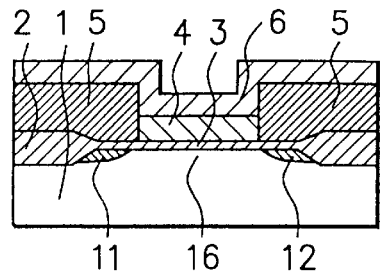

Firstly, as shown in FIG. 7A, there is formed a first gate insulating film 3 with film thickness of 80 Å by thermal oxidization method at an element region on the silicon-substrate 1 on which a field insulating film 2 is formed through LOCOS (local oxide silicon) separation method. Subsequently, there is formed a poly-silicon film 4 of film thickness of 3000 Å for the sake of a floating gate electrode (floating gate) of the whole surface of the silicon-substrate, through CVD (chemical vapor deposition) method.

Figure 7B:
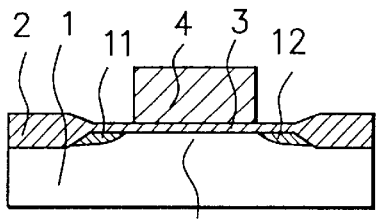
Figure 7G:
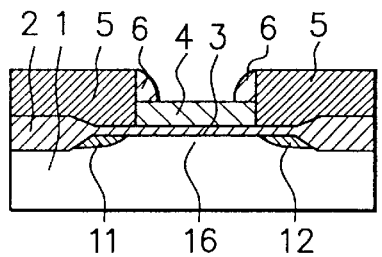

Next, as shown in FIG. 7B, there is processed the poly-silicon film 4 into the stripe shape by virtue of photolithography technology and dry etching technology to form the floating gate 4 consisting of the poly-silicon film. There is formed the source 11 and the drain diffusion layer 12, while implementing ion implantation of arsenic with the control gate (control gate electrode) 8 as a mask.

Figure 7C:
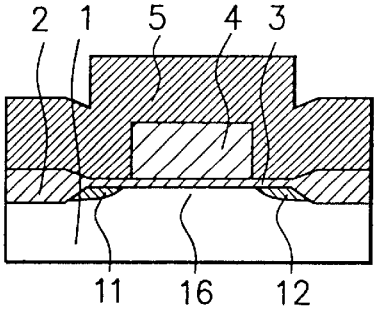
Figure 7H:
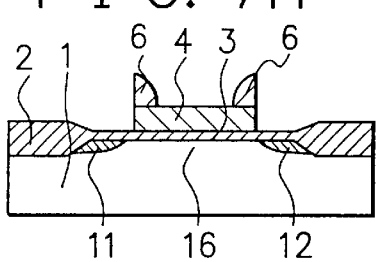
Figure 7D:
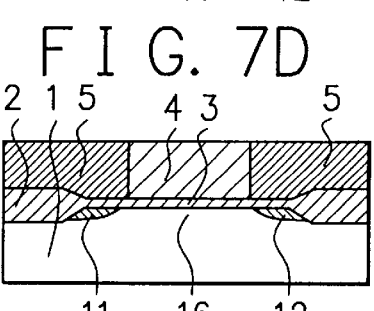
Figure 7I:
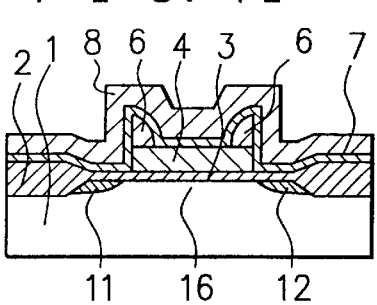

Next, as shown in FIG. 7C, there is formed the silicon nitride film 5 with film thickness of 4000 Å for embedding film all over the substrate through the CVD method, continuously, as shown in FIG. 7D, the silicon nitride film 5 is polished flatly by CMP as far as the poly-silicon film 4 being exposed.

Figure 7E:
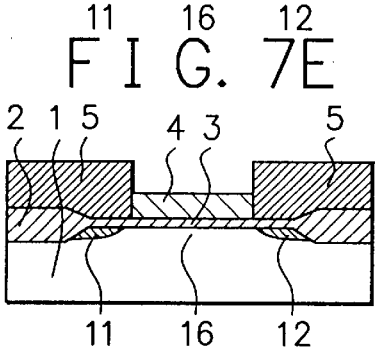
Figure 7J:
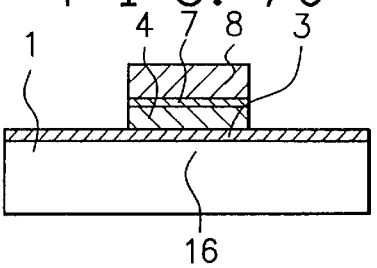
FIG. 7J is a sectional view showing such non-volatile memory in the source to drain direction.

Subsequently, as shown in FIG. 7E, there is dug down the poly-silicon film 4 for the sake of the floating gate electrode as far as the film thickness becoming 1500 Å through the dry etching technology.

Next, as shown in FIG. 7F, there is formed the poly-silicon film (floating gate) 6 with film thickness of 1500 Å of the whole surface of the silicon-substrate through the CVD method.

Continuously, as shown in FIG. 7G, there is formed a side wall on the concave shaped side wall of the silicon nitride film 5 by the poly-silicon film 6 in such a way that the poly-silicon film 6 is subjected to etch back as far as the silicon nitride film 5 being exposed, with anisotropy dry etching used, thus using this side wall by way of the floating gate 6. Consequently, in the embodiment 4 of the present invention, the floating gate 6 rises from both ends of the floating gate 4, and the floating gate electrode is constituted from combination of the floating gates 4 and 6, thus being formed as the groove with deep concave shape corresponding to quantity that the floating gate 6 rises from the floating gate 4.

Next, as shown in FIG. 7H, there is removed the silicon nitride film 5 through the wet etching.

Next, as shown in FIG. 7I, there is formed the ONO (silicon oxide-silicon nitride-silicon oxide) film 7 to be the second gate electrode of the whole surface of the silicon-substrate. Moreover, there is accumulated the poly-silicon film (control gate) 8 for the sake of the control gate electrode of the whole surface of the silicon-substrate, then as shown in FIG. 7J, forming the control gate 8 consisting of the poly-silicon film, while being etching-processed the poly-silicon film 8 into stripe shaped pattern which is perpendicular to the stripe shaped floating gates 4 and 6 by virtue of the photolithography technology and the dry etching. In this case, there is etching-processed the control gate (control gate electrode) 8, the second gate insulating film 7, and the floating gates (floating gate electrode) 4 and 6 as far as the first gate insulating film 3 being exposed. The control gate (control gate electrode) 8 becomes control gate electrode pattern corresponding to the word line.

As described above, according to the present invention, there can be formed the shape of the floating gate (floating gate electrode) into deep concave shape with self-adjustment, and there can be increased the junction capacitance between the floating gate of the floating gate type memory cell and the control gate without changing of the cell area, with the result that it is capable of realizing operation of high speed and low power consumption.

While preferred embodiments of the invention have been described using specific terms, such description is for illustrative purpose only, and it is to be understood that changes and variations may be made without departing from the spirit or scope of the following claims.

What is claimed is:

1. A method of manufacturing a floating gate type semiconductor non-volatile memory including a floating gate formed on a semiconductor-substrate through a first gate insulating film, and a control gate which is subjected to capacitive junction in relation to said floating gate through a second gate insulating film, comprising the steps of:

forming a first floating gate;

forming an insulating film on an entire surface of a semiconductor substrate, the insulating film covering said first floating gate;

polishing said insulating film exposing an under layer film of said insulating film over said first floating gate;

etching said under layer film by self-adjustment etching in order to form a concave shaped space with said insulating film and said first floating gate;

forming a second floating gate by amorphous silicon film, poly-crystal silicon film, or a combination thereof, on the entire surface of the semiconductor substrate; and etching back said second floating gate by dry etching forming a side wall on a surface of said concave shaped space.

2. The method of manufacturing a floating gate type semiconductor non-volatile memory as claimed in claim 1, wherein said under layer film is the first floating gate.

* * * * *